US010591554B2

(12) United States Patent
Kalon et al.

(10) Patent No.: US 10,591,554 B2
(45) Date of Patent: Mar. 17, 2020

(54) GRAPHENE BASED MAGNETORESISTANCE SENSORS

(71) Applicant: NATIONAL UNIVERSITY OF SINGAPORE, Singapore (SG)

(72) Inventors: Gopinadhan Kalon, Singapore (SG); Hyunsoo Yang, Singapore (SG); Young Jun Shin, Singapore (SG); Antonio Helio Castro Neto, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 15/107,628

(22) PCT Filed: Dec. 26, 2014

(86) PCT No.: PCT/SG2014/000619
§ 371 (c)(1),
(2) Date: Jun. 23, 2016

(87) PCT Pub. No.: WO2015/099614
PCT Pub. Date: Jul. 2, 2015

(65) Prior Publication Data
US 2016/0320458 A1 Nov. 3, 2016

Related U.S. Application Data

(60) Provisional application No. 61/964,268, filed on Dec. 27, 2013.

(51) Int. Cl.
*G01R 33/09* (2006.01)
*B82Y 25/00* (2011.01)
*H01F 10/00* (2006.01)

(52) U.S. Cl.
CPC .............. *G01R 33/09* (2013.01); *B82Y 25/00* (2013.01); *H01F 10/005* (2013.01)

(58) Field of Classification Search
None
See application file for complete search history.

(56) References Cited

U.S. PATENT DOCUMENTS

2004/0257894 A1* 12/2004 Onogi ................... B82Y 10/00
365/202
2009/0315551 A1* 12/2009 Hu ......................... B82Y 25/00
324/252

(Continued)

FOREIGN PATENT DOCUMENTS

CN    102217072 A    10/2011
CN    102520377 A    6/2012

(Continued)

OTHER PUBLICATIONS

Gopinadhan Kalon et al., "Tunable metal-insulator transitions in bilayer grapheme by thermal annealing", Applied Physics Letters; (2011), vol. 98, Issue 23, p. 233108.

(Continued)

*Primary Examiner* — Nasima Monsur
(74) *Attorney, Agent, or Firm* — Innovation Capital Law Group, LLP; Vic Lin

(57) ABSTRACT

A graphene structure is provided. The graphene structure comprises a substrate layer and at least two graphene layers disposed on the substrate. The at least two graphene layers comprises a gate voltage tuned layer and an effective graphene layer and the effective graphene layer comprises one or more graphene layers. A magnetoresistance ratio of the graphene structure is determined by a difference in a charge mobility and/or a carrier density between the gate voltage tuned layer and the effective graphene layer. The charge mobility and/or the carrier density of the gate no voltage tuned layer is tunable by a gate voltage applied to the (Continued)

graphene structure. A magnetic field sensor comprising the graphene structure is also provided.

16 Claims, 7 Drawing Sheets

(56) References Cited

U.S. PATENT DOCUMENTS

| | | | | |
|---|---|---|---|---|
| 2011/0037464 | A1* | 2/2011 | Gurney | G01R 33/09 |
| | | | | 324/252 |
| 2011/0068290 | A1* | 3/2011 | Haddon | C12Q 1/6881 |
| | | | | 252/62.51 R |
| 2011/0068320 | A1* | 3/2011 | Marinero | B82Y 10/00 |
| | | | | 257/9 |
| 2011/0101365 | A1* | 5/2011 | Kim | H01L 29/78684 |
| | | | | 257/66 |
| 2011/0102068 | A1* | 5/2011 | Bouchiat | G01N 27/4146 |
| | | | | 327/527 |
| 2011/0149670 | A1* | 6/2011 | Heo | B32B 9/00 |
| | | | | 365/225.5 |
| 2012/0063033 | A1* | 3/2012 | Gurney | G01R 33/095 |
| | | | | 360/234.3 |
| 2013/0018599 | A1 | 1/2013 | Peng | |
| 2013/0330885 | A1* | 12/2013 | Chen | H01L 29/78 |
| | | | | 438/151 |

FOREIGN PATENT DOCUMENTS

| | | |
|---|---|---|
| CN | 102707246 A | 10/2012 |
| CN | 103000535 A | 3/2013 |
| CN | 103107292 A | 5/2013 |
| CN | 103323796 A | 9/2013 |
| CN | 103400859 A | 11/2013 |
| JP | 2012215498 A | 11/2012 |

OTHER PUBLICATIONS

Huilong Xu et al., "Batch-fabricated high-performance grapheme Hall elements", Scientific Reports, (2013), vol. 3, 1207; DOI: 10.1038/srep01207.

International Search Report & Written Opinion from corresponding International PCT Patent Application No. PCT/SG2014/000619, 10 pages.

Gopinadhan Kalon, et al., "Giant magnetoresistance in single-layer graphene flakes with a gate-voltage-tunable weak antilocalization", Nov. 25, 2013, Physical Review B 88, pp. 195429-1 to 195429-6.

S. Russo, et al., "Electronic Transport Properties of Few-Layer Graphene Materials, Graphene—Synthesis, Characterization, Properties and Applications", Prof. Jian Gong (Ed.), ISBN: 978-953-307-292-0, InTech, 2011.

Carlos Diaz-Pinto et al., "Tunable magnetoresistance behavior in suspended graphitic multilayers through ion implantation", Physical Review. B, Condensed Matter and Materials Physics, vol. 83, No. 23, Jun. 2011.

Extended European Search Report dated Aug. 7, 2017 from European Application No. 14874834.6.

Nan, F. et al., "Progress of Properties, Modification and Applications of Graphene on SiC Substrate", Acta Chimica Sinica, vol. 70, Sep. 2012, pp. 2197-2207.

* cited by examiner

GRAPHENE BASED MAGNETORESISTANCE SENSORS

PRIORITY CLAIM

The present application claims priority to U.S. Patent Application No. 61/964,268, filed 27 Dec. 2013.

FIELD OF THE INVENTION

The present invention generally relates to magnetoresistance sensors, and more particularly relates to graphene based magnetoresistance sensors.

BACKGROUND

Magnetic sensors such as Hall sensors and magnetoresistance sensors are widely used in daily life as speed sensors, position sensors in refrigerators, mobile phones, washing machines, and laptops, and the like.

Hall sensors where the Hall resistance changes under an external magnetic field typically make use of semiconductors such as Silicon, InAs, GaAs and InSb. Hall sensors based on Silicon are suitable for monolithic integration, but due to low mobility of the carriers, have a poor sensitivity which is defined as the voltage generated for unit magnetic field (mV/mT). Hall sensors based on InSb semiconductors have a high sensitivity due to the high mobility of about 40,000 $cm^2/(V \cdot s)$, but this high mobility requires an expensive micro thick film. Also, these InSb based Hall sensors have an undesirable large change in resistance for unit degree of temperature change, i.e. a high temperature coefficient of resistance. Further, Hall sensors have relatively high sensitivity in moderate and high magnetic field; however, the sensitivity is poor in low fields.

Researches have been done on magnetoresistance sensors for the availability, the low energy consumption and the low cost. Magnetoresistance measures a change in the electrical resistance of a material under an external magnetic field. This important technological feature contributes to the success of the information storage industry in reading data from a magnetic hard disk media. A read head incorporated with the material having magnetoresistance is extremely sensitive to low (stray) magnetic field. Magnetoresistance sensors have a high sensitivity in low fields. However, they suffer from cross field error, especially anisotropic magnetoresistance sensor, and are not suitable for detecting large fields.

Thus, what is needed is a magnetic sensor having a high sensitivity in both low and high magnetic fields and a low temperature coefficient of resistance as well as low costs. Also, thin film based sensors are more preferred than bulk ones due to its compactness and cost effectiveness. Furthermore, other desirable features and characteristics will become apparent from the subsequent detailed description and the appended claims, taken in conjunction with the accompanying drawings and this background of the disclosure.

SUMMARY

According to a first aspect, a graphene structure is provided. The graphene structure comprises a substrate layer and at least two graphene layers disposed on the substrate. The at least two graphene layers comprises a gate voltage tuned layer and an effective graphene layer and the effective graphene layer comprises one or more graphene layers. A magnetoresistance ratio of the graphene structure is determined by a difference in a charge mobility and/or a carrier density between the gate voltage tuned layer and the effective graphene layer. The charge mobility and/or the carrier density of the gate voltage tuned layer is tunable by a gate voltage applied to the graphene structure.

According to a second aspect, a magnetic field sensor is provided. The magnetic field sensor comprises a substrate layer and at least two graphene layers disposed on the substrate. The at least two graphene layers have electrodes fabricated thereon. The at least two graphene layers comprises a gate voltage tuned layer and an effective graphene layer and the effective graphene layer comprises one or more graphene layers. A magnetoresistance ratio of the graphene structure is determined by a difference in a charge mobility and/or a carrier density between the gate voltage tuned layer and the effective graphene layer. The charge mobility and/or the carrier density of the gate voltage tuned layer is tunable by a gate voltage applied to the graphene structure through the electrodes.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

Skilled artisans will appreciate that elements in the figures are illustrated for simplicity and clarity and have not necessarily been depicted to scale. For example, the dimensions of some of the elements in the schematic diagram may be exaggerated in respect to other elements to help to improve understanding of the present embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a novel multilayer graphene based magnetoresistance sensor. This multilayer graphene based magnetoresistance sensor provides a high sensitivity in both low magnetic fields and high magnetic fields. Further, the present multilayer graphene based magnetoresistance sensor is nearly temperature independent and thus does not require temperature drift correction circuitry at a typical working temperature of 400 K. Lastly, the present multilayer graphene based magnetoresistance sensor shows tunable magnetoresistance under different gate voltages. A multilayer graphene structure is also proposed to be included in devices where such properties are preferred.

Figure 1:
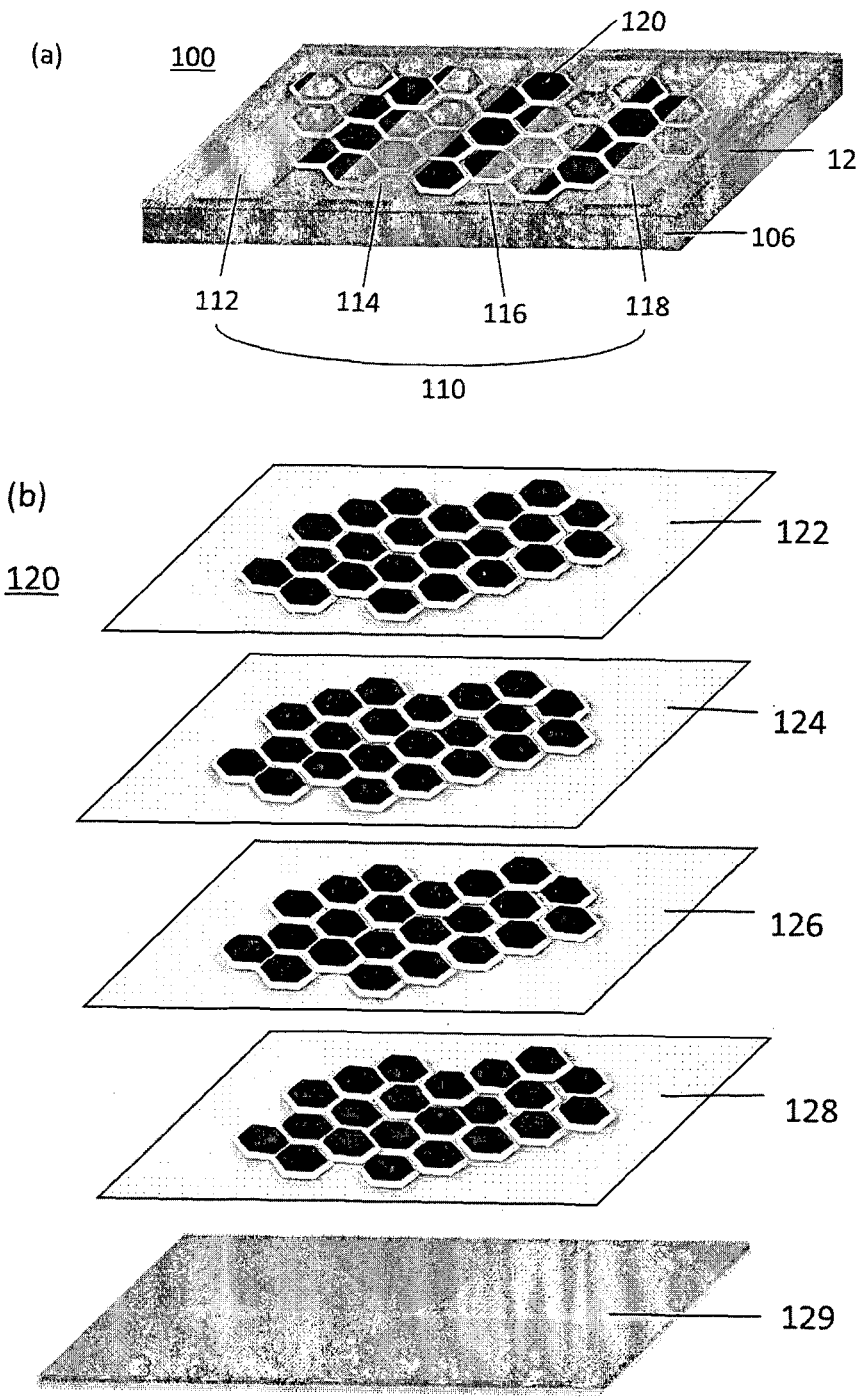
FIG. 1(a) depicts a schematic diagram of multilayer graphene based magnetoresistance sensor with electrodes in accordance with a present embodiment.
FIG. 1(b) depicts an exploded view of a graphene structure included in the graphene based magnetoresistance sensor in FIG. 1(a) in accordance with the present embodiment.

Referring to FIG. 1(a), a multilayer graphene based magnetoresistance sensor 100 is depicted in accordance with a present embodiment. Graphene consists of a single layer of carbon atoms arranged in a honey-comb fashion. Multilayer graphene is a stack of single layer carbon atoms arranged in a hexagonal periodic lattice. It is to be understood that in the present embodiment, multilayer graphene is used; however, in some other embodiment, single layer or multilayer graphene oxide, single layer or multilayer graphene composite, or single layer or multilayer graphene derivatives may be used. The multilayer graphene based magnetoresistance sensor 100 comprises a graphene structure 120 on a base layer 106 and electrodes 110. The base layer 106 may be heavily doped Silicon. The base layer 106 may be a flexible sheet. An exploded view of the graphene structure 120 is shown in FIG. (1)(b). The graphene structure 120 comprises four layers of graphene 122, 124, 126 and 128 on a substrate 129. It is understood that although four layers of graphene are shown here, different number of graphene layer can be used, for example, 3, 5 or 6 layers. The substrate 129 may comprise a silicon/silicon oxide substrate, a Boron nitride substrate, or the like. Electrodes 110 including 112, 114, 116 and 118 are positioned in parallel on top of the graphene structure 120 and are in contact with the top layer of graphene such that the graphene structure lies between the electrodes 110 and the substrate 129. Measurements can be made by connecting two electrodes to voltages and the other two electrodes to currents. For example, the furthest two electrodes 112 and 118 may be connected to currents and electrodes 114 and 116 may be connected to voltages. Also, the nearest two electrodes 112 and 114 may be connected to currents and electrodes 116 and 118 may be connected to voltages, which is referred as non-local measurement. The electrodes may comprise Cr and/or Au.

Multilayer graphene can be prepared by peeling off multilayer graphene from Kish graphite or by a chemical vapor deposition (CVD) techniques. With the advance of CVD techniques, large area of multilayer graphene samples can be easily prepared which make the present magnetoresistance sensor industrial viable.

The transport behavior of the multilayer graphene based magnetoresistance sensor has been theoretically considered in the presence of an external magnetic field and an electrical field. In this theoretical considerations, the graphene structure is assumed to comprise two layers of graphene and each layer has a three dimensional (3D) carriers density $n_{i=1,2}$ and a charge mobility $\mu_{i=1,2}$. The two layers of graphene are considered as two dimensional (2D) films. Under the assumption that the Drude model for electrical conduction is applicable here, in the absence of a magnetic field the conductivity (σ) of the graphene structure is given by:

$$\sigma_{D,i} = en_i\mu_i \qquad (1)$$

In the presence of a magnetic field B along the z-axis which is normal to the plane of the film and an electric field E along the x-axis in the plane of the film, the 3D current density (J) of the film is given by:

$$\vec{J} = \overleftrightarrow{\sigma_i}\vec{E} \qquad (2)$$

where $$\sigma_i = \begin{bmatrix} \sigma_{xx,i} & \sigma_{xy,i} \\ \sigma_{yx,i} & \sigma_{yy,i} \end{bmatrix}$$

is the conductivity tensor.

In the Drude model it is deduced that:

$$\sigma_{xx,i} = \sigma_{yy,i} = \frac{\sigma_{D,i}}{1+(B\mu_i)^2} = \frac{en_i\mu_i}{1+(B\mu_i)^2} \qquad (3)$$

$$\sigma_{xy,i} = \sigma_{yx,i} = \frac{B\mu_i\sigma_{D,i}}{1+(B\mu_i)^2} = \frac{eBn_i\mu_i^2}{1+(B\mu_i)^2} \qquad (4)$$

If the two graphene layers are placed together and since they are under the same electric field, the total current running through the graphene structure will be $$\vec{J} = \vec{j}_1 + \vec{j}_2 = (\sigma_1 + \sigma_2)\vec{E} \qquad (5)$$

That is, the total conductivity of the 2-layer graphene structure is $$\sigma = \sigma_1 + \sigma_2 \qquad (6)$$

This is comparable with the condition of two resistors in parallel except that here is the sum of two tensors, instead of scalars. The resistivity tensor is obtained by inversion of the conductivity tensor: $\rho = \sigma^{-1}$ and gives:

$$\rho_{xx} = \rho_{yy} = \frac{\sigma_{xx}}{\sigma_{xx}^2 + \sigma_{xy}^2} \qquad (7)$$

-continued $$\rho_{xy} = -\rho_{yx} = \frac{\sigma_{xy}}{\sigma_{xx}^2 + \sigma_{xy}^2} \quad (8)$$

Substituting equations (3), (4) and (6) in equations (7) and (8), the resistivity of the sample is given by $$e\rho_{xx} = \frac{\frac{n_1\mu_1}{1+B^2\mu_1^2} + \frac{n_2\mu_2}{1+B^2\mu_2^2}}{\left(\frac{n_1\mu_1}{1+B^2\mu_1^2} + \frac{n_2\mu_2}{1+B^2\mu_2^2}\right)^2 + B^2\left(\frac{n_1\mu_1^2}{1+B^2\mu_1^2} + \frac{n_2\mu_2^2}{1+B^2\mu_2^2}\right)^2} \quad (9)$$

$$e\rho_{xy} = B\frac{\frac{n_1\mu_1^2}{1+B^2\mu_1^2} + \frac{n_2\mu_2^2}{1+B^2\mu_2^2}}{\left(\frac{n_1\mu_1}{1+B^2\mu_1^2} + \frac{n_2\mu_2}{1+B^2\mu_2^2}\right)^2 + B^2\left(\frac{n_1\mu_1^2}{1+B^2\mu_1^2} + \frac{n_2\mu_2^2}{1+B^2\mu_2^2}\right)^2} \quad (10)$$

Two conditions are considered. In a first condition, the magnetic field B is set as zero, that is, no magnetic field is present. The following resistivity is given from equation (9) and (10):

$$\rho_{xx,0} = \frac{1}{e(n_1\mu_1 + n_2\mu_2)} \quad (11)$$

$$\rho_{xy} = 0 \quad (12)$$

Note that in this condition if the conductivity of a first layer ($\sigma_1$) is much larger than the conductivity of the second layer ($\sigma_2$), i.e. $n_1\mu_1 \gg n_2\mu_2$, $\rho_{xx,0}=1/(en_1\mu_1)$ is obtained from equation (11). This indicates that the resistivity of the 2-layer graphene structure is determined by the charge mobility ($\mu_1$) and carrier density ($n_1$) of the first layer, i.e. the most conducting layer.

In a second condition, the magnetic field B is set to be much larger than the charge mobility ($\mu_1$) of the first layer and the charge mobility ($\mu_2$) of the second layer. The following resistivity is given from equation (9) and (10), $$\rho_{xx,\infty} = \frac{n_1\mu_2 + n_2\mu_1}{e\mu_1\mu_2(n_1 + n_2)} \quad (13)$$

$$\rho_{xy,\infty} \approx \frac{B}{e(n_1 + n_2)} \quad (14)$$

If the two layers are such that $n_2\mu_1 \gg n_1\mu_2$, Equation (11) becomes:

$$\rho_{xx,\infty} \approx \frac{n_2}{n_1+n_2}\frac{1}{\mu_2} \quad (15)$$

Equation (15) indicates that the resistivity of the 2-layer graphene structure is determined by the charge mobility ($\mu_2$) of the second layer, i.e. the least conducting layer.

In summary, where there is no magnetic field applied, the resistivity of the 2-layer graphene structure is determined by the charge mobility of the most conducting layer, whereas where there is a relative large magnetic field applied, the resistivity of the 2-layer graphene structure is determined by the charge mobility of the least conducting layer. A graphene structure comprising more than two layers can be treated as two effective layers where the layer right at the bottom in a back gated structure (i.e. with tunable charge mobility) is a first layer and the other layers as a whole are treated as a second layer. This makes the more than 2-layer graphene structure an effective 2-layer stack. Accordingly, the theoretical consideration will equally apply to those more than 2-layer graphene structure.

The maximum magnetoresistance can be obtained by:

$$MR_\infty = \frac{\rho_{xx,\infty} - \rho_{xx,0}}{\rho_{xx,0}} = \frac{n_1 n_2}{(n_1+n_2)^2}\frac{(\mu_1-\mu_2)^2}{\mu_1\mu_2} \quad (16)$$

In this condition where $\mu_1 \gg \mu_2$, the magnetoresistance is given by $$MR_\infty \approx \frac{n_1 n_2}{(n_1+n_2)^2}\frac{\mu_1}{\mu_2} \gg 1 \quad (17)$$

Equation (13) indicates the magnetoresistance can be arbitrarily large by adjusting the difference between the charge mobility of the first layer and the charge mobility of the second layer.

Figure 2:
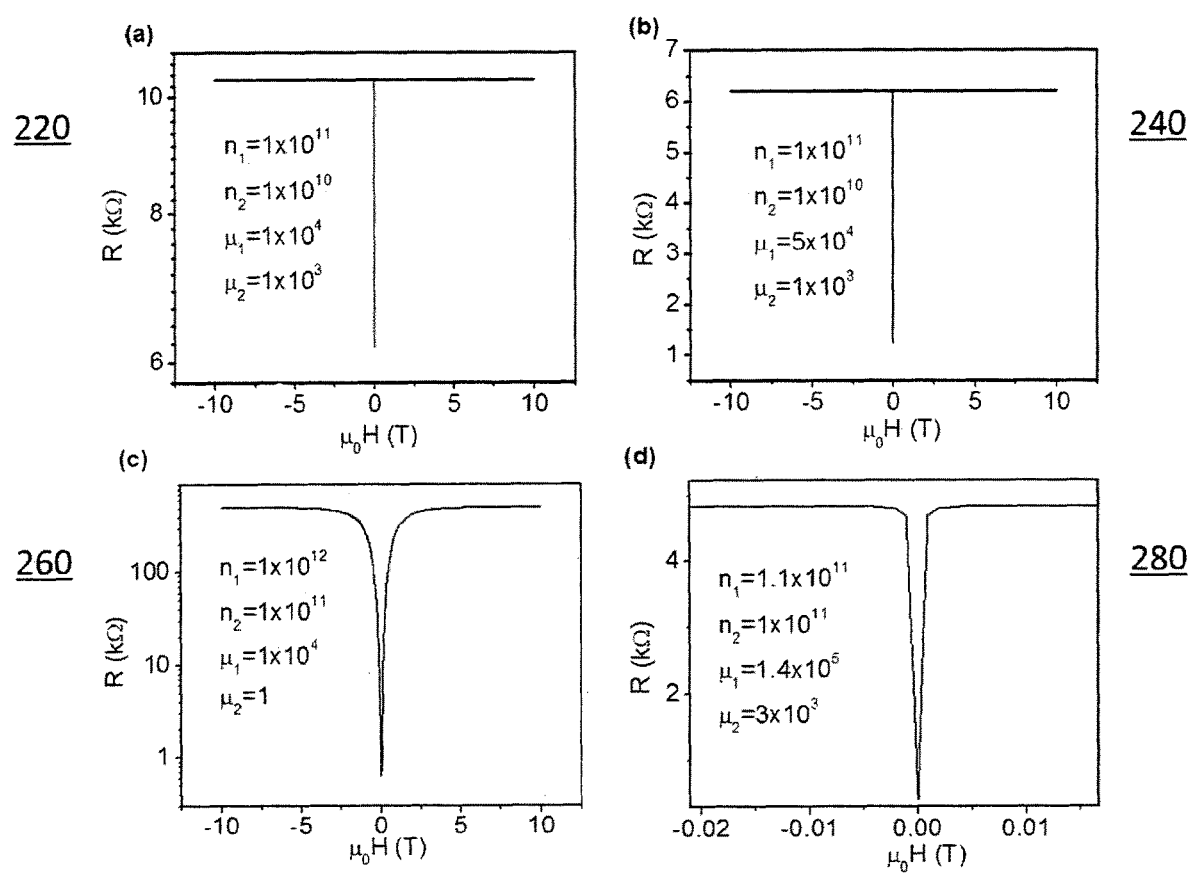
FIG. 2 depicts graphs of theoretically simulated magnetoresistance behavior of the graphene based magnetoresistance sensor in FIG. 1 in accordance with the present embodiment, as a function of an external magnetic field with various carrier density n and charge mobility µ.

Now referring to FIG. 2, the simulation results of resistivity of the two layer graphene structure are depicted with various parameters of charge mobility and carrier density. FIG. 2(a) and FIG. 2(b) shows that the resistivity increases from zero to the maximum as soon as a magnetic field is applied. In FIG. 2(a), the following parameters are used: $n_1=1\times10^{11}$ cm$^{-2}$, $n_2=1\times10^{10}$ cm$^{-2}$, $\mu_1=1\times10^4$ cm$^2$/(V·s), $\mu_2=1\times10^3$ cm$^2$/(V·s) and the maximum resistivity is more than 10 kΩ as seen in graph 220. In FIG. 2(a), the following parameters are used: $n_1=1\times10^{11}$ cm$^{-2}$, $n_2=1\times10^{10}$ cm$^{-2}$, $\mu_1=5\times10^4$ cm$^2$/(V·s), $\mu_2=1\times10^3$ cm$^2$/(V·s) and the maximum resistivity is more than 6 kΩ as seen in graph 240.

FIG. 2(c) shows that the resistivity increases from zero to the maximum as the magnetic field is increased from zero to about 1 T; whereas FIG. 2(d) shows that the resistivity increases from zero to the maximum as the magnetic field is increased from zero to about 0.001 T. This provides a high sensitivity at low magnetic fields. In FIG. 2(c), the following parameters are used: $n_1=1\times10^{12}$ cm$^{-2}$, $n_2=1\times10^{11}$ cm$^{-2}$, $\mu_1=1\times10^4$ cm$^2$/(V·s), $\mu_2=1$ cm$^2$/(V·s) and the maximum resistivity is more than 100 kΩ as seen in graph 260. The charge mobility ($\mu_1$) of the first layer is about $10^4$ times of the charge mobility ($\mu_2$) of the second layer. The magnetoresistance of up to 8.6×10$^4$% can be obtained with the parameters used for FIG. 2(c). In FIG. 2(d), the following parameters are used: $n_1=1.1\times10$ cm$^{-2}$, $n_2=1\times10^{11}$ cm$^{-2}$, $\mu_1=1.4\times10^5$ cm$^2$/(V·s), $\mu_2=3\times10^3$ cm$^2$/(V·s) and the maximum resistivity is more than 4 kΩ as seen in graph 280. The charge mobility ($\mu_1$) of the first layer is about 470 times of the charge mobility ($\mu_2$) of the second layer. The magnetoresistance of up to 1000% can be obtained with the parameters used for FIG. 2(d). It can be seen that the magnetoresistance of the graphene structure is determined by the difference of the charge mobility of the graphene layers and thus is manipulatable by changing the difference of the charge mobility of the graphene layers.

Large magnetoresistance can be obtained as the resistivity changes abruptly even at low magnetic fields. From results shown in FIG. 2, it can be inferred that a larger mobility or a lower carrier density of a first layer with respect to a second layer is essential to obtain a high magnetic field sensitivity at low magnetic fields, wherein the charge mobility and the carrier density of the first layer is tunable under gate voltages. Charge mobility can be improved by using a cleaner or flatter substrate which reduces charged impurity scattering, for example a Boron nitride substrate. Carrier density can be adjusted by tuning a gate voltage applied to the graphene structure. Specifically, the carrier density of the graphene structure is at it minimum when the gate voltage is at the charge neutrality point (CNP) where equal number of electrons and holes exist. The carrier density at the CNP is of the order of ~$10^{10}$-$10^{11}$ cm$^{-2}$ depending the property of the graphene structure. From the Drude's conductivity model, the charge mobility can be calculated. The charge mobility at the CNP is highest and decreases on both sides of the CNP. The charge mobility of the graphene structure at its CNP is capable to be higher than 10,000 cm$^2$/(V·s). According to the theoretical predictions discussed above, when the gate voltage approaches the CNP, the magnitude of the magnetoresistance as well as the detection limit of the magnetic field should increase.

Figure 3:
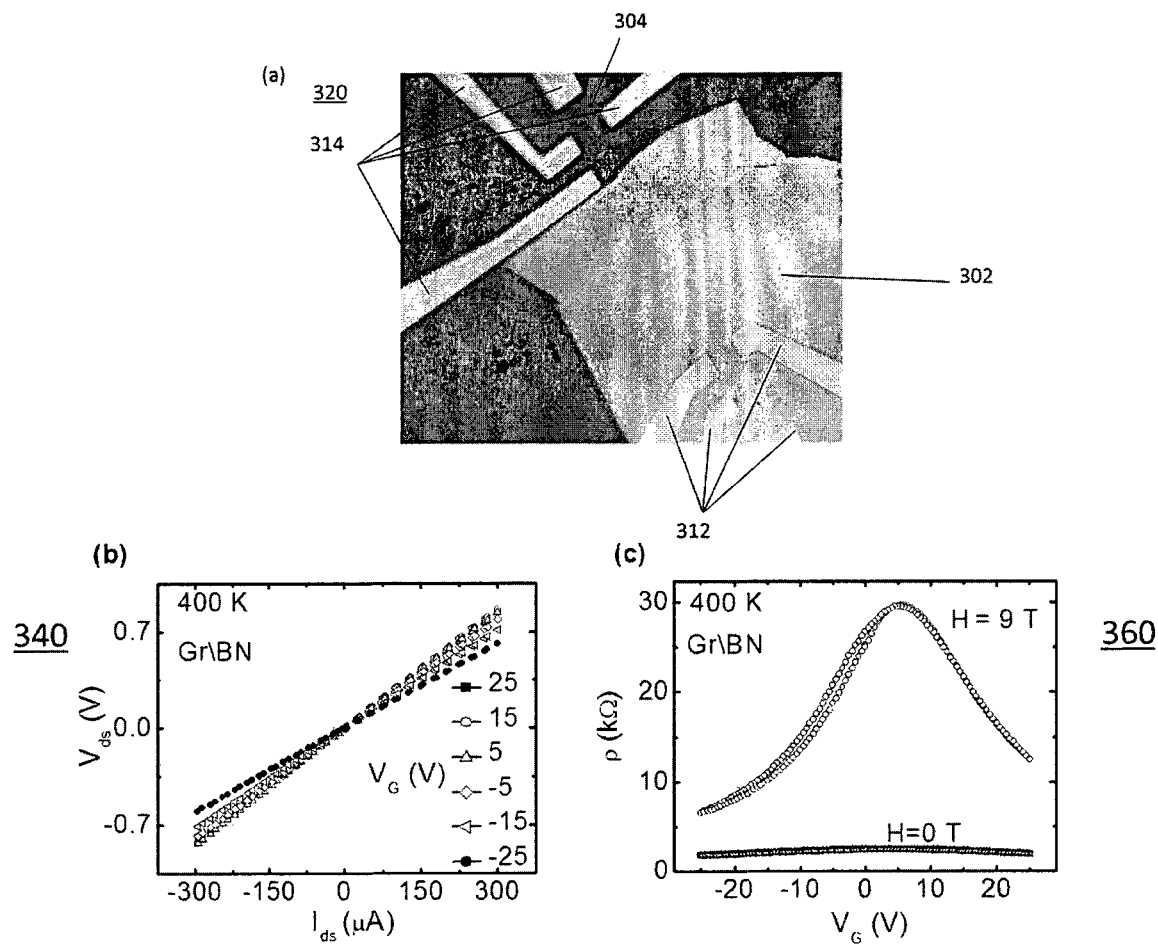
FIG. 3(a) depicts an optical micrograph of the fabricated 4-layer graphene sensor on Boron nitride and $SiO_2$ substrates.
FIG. 3(b) depicts a graph of the source voltage ($V_{ds}$) of the sensor having a Boron nitride substrate as a function of the drain-source current ($I_{ds}$) at the gate voltages ($V_G$) from −25 V to 25 V.
FIG. 3(c) depicts a resistance graph of the sensor having a Boron nitride substrate as a function of the back gate voltage at a temperature of 400 K at no magnetic field and a normal external magnetic field of 9 T.

Referring to FIG. 3(a), an optical micrograph 320 of the fabricated multilayer graphene magnetoresistance sensor is shown. The sensor was prepared by a two-step mechanical transfer process and has 4 layers of graphene. The sensor comprises two graphene structures 302 and 304. The gray area 302 is a graphene structure having a Boron nitride substrate whereas the dark area 304 is a graphene structure having a silicon/silicon oxide substrate. The bright area 312 comprising four parts is Cr/Au electrodes for the graphene structure having a Boron nitride substrate. The bright area 314 comprising four parts is Cr/Au electrodes for the graphene structure having a silicon/silicon oxide substrate. The graphene structures here comprise 4 layers.

The contact between the 4-layer graphene structure having a Boron nitride substrate and the electrodes is tested by measuring the source voltage versus source-drain current. The result is shown as graph 340 in FIG. 3(b). A linear relationship can be seen for all gate voltages from −25 V to 25 V at a temperature of 400 K, implying an ohmic contact between the 4-layer graphene structure and the electrodes. A maximum slope corresponding to a maximum resistivity is obtained at the back gate voltage of 5-15 V which is around the CNP of the graphene structure. The CNP is broad which could be related to the different band structures of the multilayer graphene and the thermal smearing of the Fermi surfaces in the multilayer graphene. The electric field effect is expected to decay when the graphene layer number increases due to charge screening effects. Results show that the electric field effect is still prominent up to 6 layers.

Referring to FIG. 3(c), a resistance graph 360 of the 4-layer graphene structure having a Boron nitride substrate is depicted as a function of the back gate voltage at a temperature of 400 K at the external magnetic field of 0 T and 9 T normal to the plane of the 4-layer graphene structure. It is clear from FIG. 3(c) that the applied magnetic field increases the resistance of charge carriers resulting a positive magnetoresistance at all gate voltages. Even though an increase in resistance is seen at all gate voltages, a much larger change is seen near the CNP due to lower carrier densities and larger mobility, which supports the theoretical consideration discussed above. A maximum resistivity of 30 kΩ is obtained at a back gate voltage of about 5 V at the magnetic field of 9 T.

Figure 4:
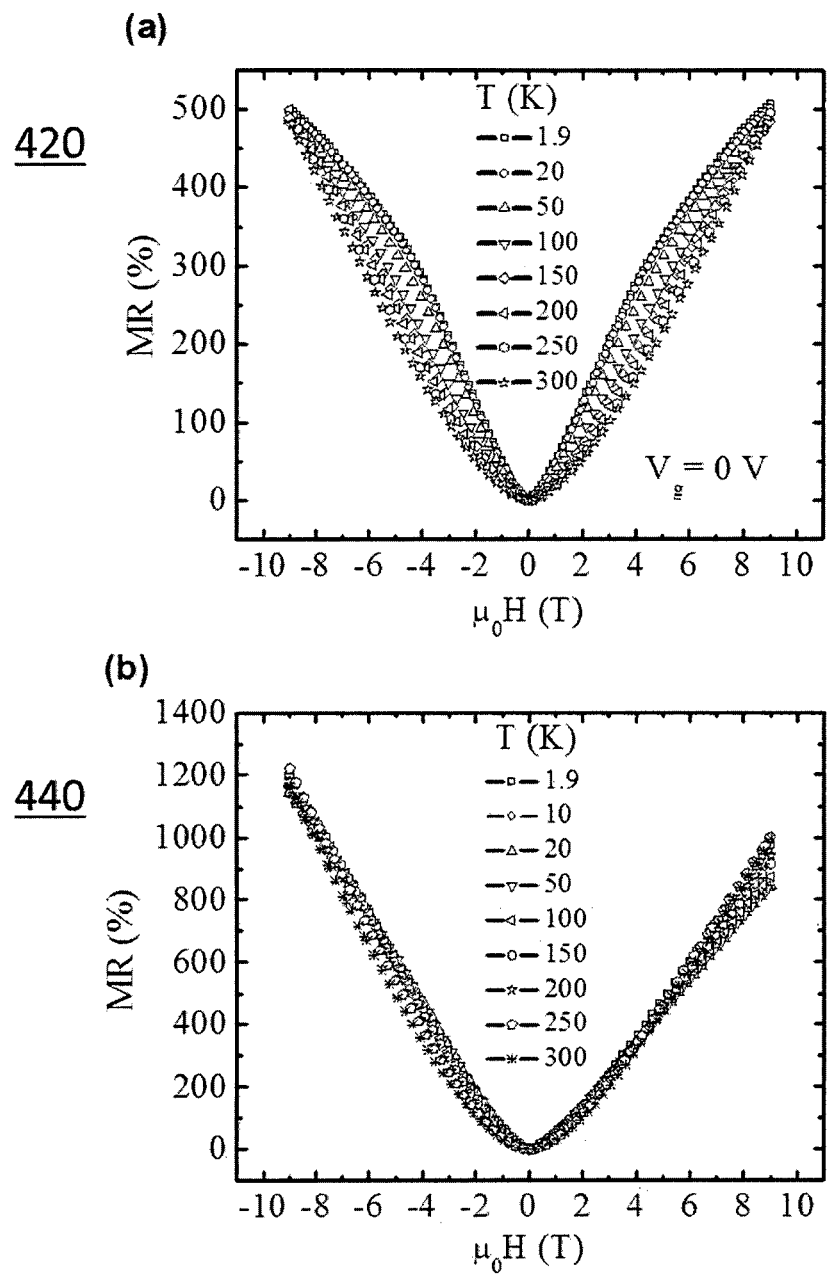
FIG. 4 depicts graphs of magnetoresistance of (a) a 5-layer graphene sample and (b) a 5 to 6-layer graphene sample on $SiO_2$ substrates as a function of external magnetic field (H) at temperatures from 1.9 K to 300 K.

The temperature dependence of the magnetoresistance of the graphene structure is described as follows. The graphene structure samples here, prepared by scotch tape technique, comprise 5-layers or 5-6 layers of graphene on a SiO$_2$ substrate. A magnetoresistance sensor including the graphene structure has a typical sample size of 20×5 μm$^2$. The resistance is measured in a linear four probe geometry with Cr (5 nm)/Au (80 nm) contacts. Referring to FIG. 4(a), graphs 420 of magnetoresistance of the 5-layer graphene structure sample are depicted as a function of the external magnetic field (H) at temperatures from 1.9 K to 300 K. No gate voltage is applied and the current is 30 μA. It is to be noted that the magnetoresistance is independent of the current. It can be seen that at the magnetic fields in a range from 2 T to 8 T, the magnetoresistance at a lower temperature is slightly larger than the magnetoresistance at a higher temperature. However, the difference in the magnetoresistance in view of the different temperatures is not significant and the magnetoresistance of the 5-layer graphene structure is weakly temperature dependent. A giant magnetoresistance of 500% is obtained at a magnetic field of 9 T at nearly all temperatures including room temperature of 300 K. This giant magnetoresistance will provide a high sensitivity of the magnetoresistance sensor. Graphs 440 of magnetoresistance of the 5 to 6 layer graphene structure sample are depicted as a function of external magnetic field at temperatures from 1.9 K to 300 K in FIG. 4(b). The magnetoresistance of different temperatures nearly overlaps each other, indicating a temperature independence characteristic of the sensor. This temperature independence will in turn provide a small value of the temperature coefficient of resistance (TCR). TCR is an important parameter to determine the practical use of sensors, since a large TCR implies a large drift in resistance for a given temperature difference and hence the additional need of electronic circuitry for temperature correction. Accordingly, no electronic circuitry is necessary for the present magnetoresistance sensor. A giant magnetoresistance of 1000% is obtained at a magnetic field of 9 T at nearly all temperatures including room temperature of 300 K. It is understood that in the present embodiment, the graphene structure having a SiO$_2$ substrate; however, in some other embodiment, the graphene structure may have another type of substrate, for example, Boron nitride. As will be seen below with respect to FIG. 7(a), the magnetoresistance of the 4-layer graphene structures having a Boron nitride substrate provides small TCR for temperature ranging from 300 K to 400 K.

Figure 5:
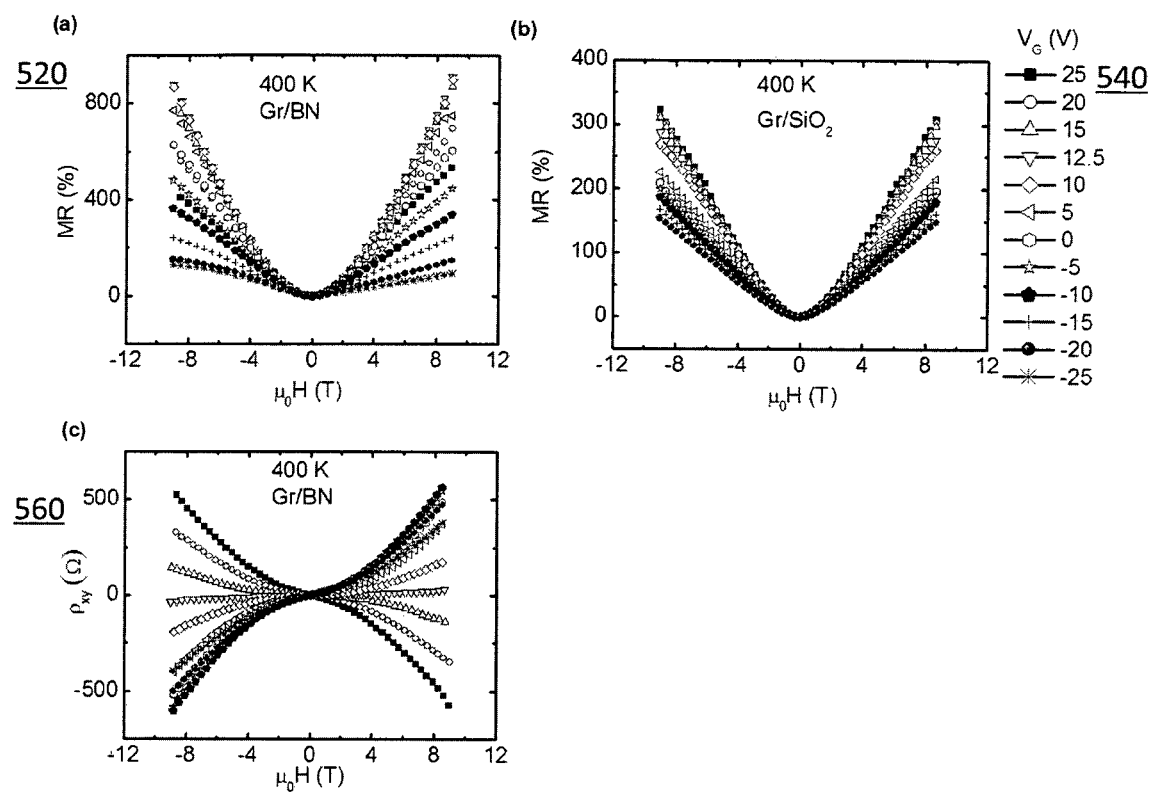
FIG. 5(a) depicts magnetoresistance graphs of a 4-layer graphene structure sample on a Boron nitride substrate as a function of the external magnetic field at gate voltages from −25 V to 25 V at a temperature of 400 K.
FIG. 5(b) depicts magnetoresistance graphs of a 4-layer graphene sample on a silicon/$SiO_2$ substrate as a function of the external magnetic field at gate voltages from −25 V to 25 V at a temperature of 400 K.
FIG. 5(c) depicts a graph of Hall resistivity ($\rho_{xy}$) as a function of a normal external magnetic field at gate voltages from −25 V to 25 V at a temperature of 400 K.

The magnetoresistance characteristics of the graphene structures will now be described at a temperature of 400 K with reference to FIG. 5. 400 K is a typical working temperature for a magnetoresistance sensor and it has not been disclosed for a graphene based magnetoresistance sensor at this temperature. Referring to FIG. 5(a), magnetoresistance graphs 520 of a graphene structure samples having 4-layer of graphene on a Boron nitride substrate is depicted as a function of the external magnetic field at gate voltages ($V_G$) from −25 V to 25 V. It is clear that the maximum magnetoresistance is obtained while the gate voltage is near the CNP at all magnetic fields. A maximum magnetoresistance of about 880% is obtained at a magnetic field of 9 T. At the CNP, the magnetoresistance graph is parabolic/quadratic at low magnetic fields; however, it is linear at high magnetic fields with no evidence of any saturation. As the gate voltage is tuned away from the CNP, the magnetoresistance decreases on either side of the CNP. This provides a tunable magnetoresistance with respect to the gate voltage. At $V_G$=−25 V, the magnetoresistance is ~130% at a magnetic field of 9 T. The characteristics of the magnetoresistance with respect to the magnetic field are similar to that of near CNP; however, the magnetoresistance shows a saturating behavior at higher magnetic fields.

Accordingly, the magnetoresistance cannot be further increased even by applying a higher magnetic field at the gate voltage of −25 V.

Referring to FIG. 5(b), magnetoresistance graphs 540 of a graphene structure sample having 4-layers of graphene on a $SiO_2$ substrate is depicted as a function of the external magnetic field at gate voltages from −25 V to 25 V at a temperature of 400 K. It is clear that the magnetoresistance is much smaller for the graphene structure having a $SiO_2$ substrate than that of the graphene structure having a Boron nitride substrate as shown in FIG. 5(a). This may be due to the degradation in mobility of the graphene structure having the $SiO_2$ substrate. The use of a Boron nitride substrate improves the mobility by reducing charged impurities in the substrate. However, the magnetoresistance of the graphene structure having a $SiO_2$ substrate has a similar trend as that of the graphene structure having a Boron nitride substrate as shown in FIG. 5(a). This implies that the intrinsic property of multilayer graphene is responsible for the magnetoresistance characteristics. CNP is the maximum point in the resistivity or resistance versus gate voltage graph. The CNP in this case is shifted slightly to higher gate voltage than graphene on Boron nitride which clearly points to the different reactivity of the surface of graphene attached to the substrate due to difference in charge inhomogeniety. In either case, the magnetoresistance is gate voltage tunable.

Referring to FIG. 5(c), a graph 560 of Hall resistivity ($\rho_{xy}$) is depicted as a function of the external magnetic field at gate voltages from −25V to 25 V at a temperature of 400 K. In this case, the magnetic field is applied perpendicular to the plane of the graphene layers. The MR contribution arising from any geometry effect is removed from the measured Hall resistivity since the magnetic field is perpendicular to the plane of the graphene structure. The Hall resistivity shows non-linear behavior at various gate voltages, suggesting the contribution from different graphene layers with different charge mobility and carrier density. This contribution can be also considered from two effective layers, one layer being the gate voltage tuned layer and the other effective layer being the other layers as a whole. Those skilled in the art will realize that while the gate voltage tuned layer is usually the bottom layer of the two or more graphene layers; it can also be the top layer of the two or more graphene layers. At the gate voltages above the CNP, the resistivity curves show negative slopes suggesting that the majority charge carriers are electrons. At the gate voltages below the CNP, the majority carriers are holes as evidenced from the positive slopes. At CNP, the resistivity is almost zero at all magnetic fields.

Figure 6:
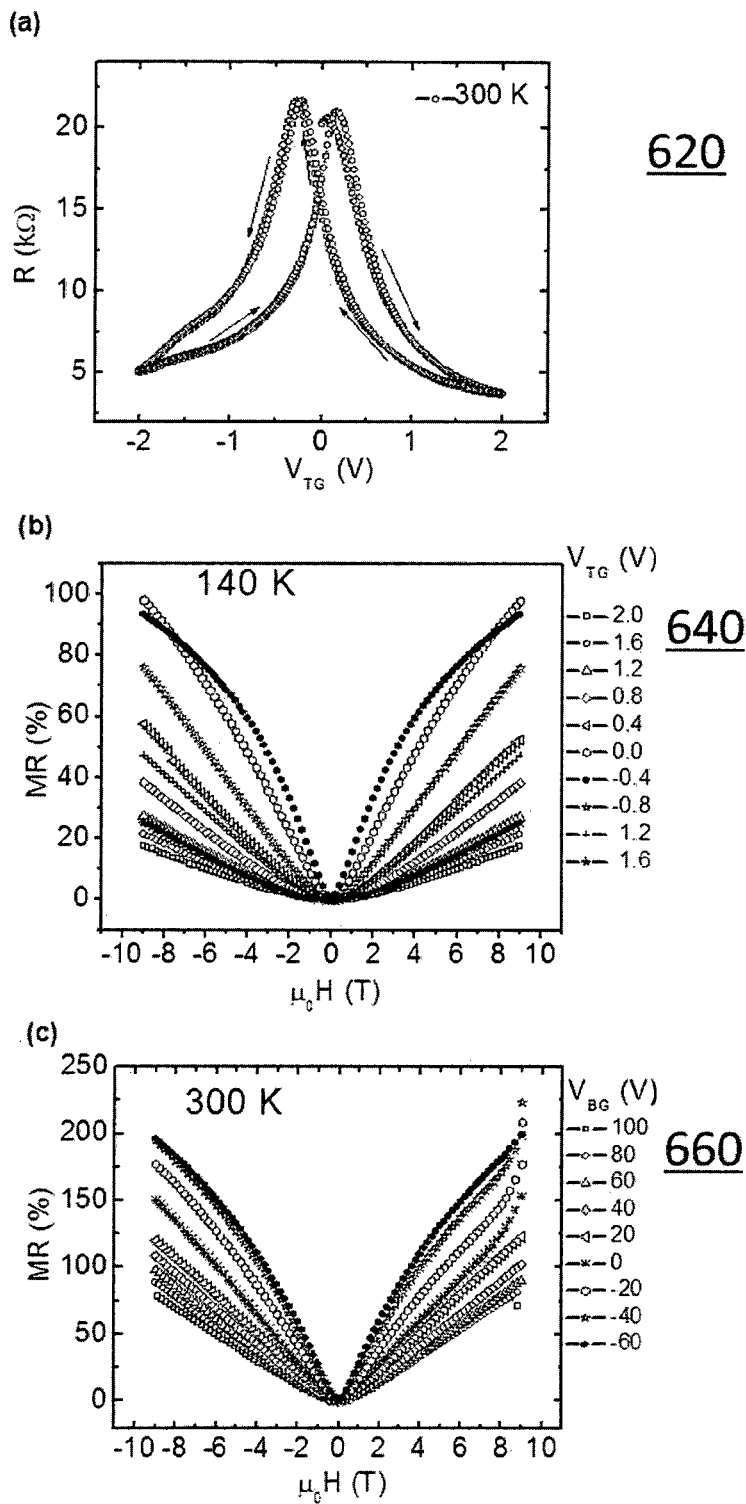
FIG. 6(a) depicts a resistance graph of a 10-layer CVD graphene sample as a function of the top gate voltage at a temperature of 300 K.
FIG. 6(b) depicts graphs of magnetoresistance as a function of the external magnetic field at top gate voltages from −1.6 V to 2.0 V at a temperature of 140 K.
FIG. 6(c) depicts graphs of magnetoresistance as a function of the external magnetic field at back gate voltages from −60 V to 100 V at a temperature of 300 K.

Referring to FIG. 6(a), a resistance graph 620 of a 10-layer graphene structure sample prepared by CVD is depicted as a function of the top gate voltage at a temperature of 300 K. No magnetic field is applied during this measurement. A magnetoresistance sensor has been fabricated with top and bottom gates having one top gate electrode and one bottom gate electrode in addition to the four electrodes on the top. The bottom gate is made by placing the 10-layer graphene structure on top of $SiO_2$ (300 nm)/Si (heavily doped) substrate and Silver paste is used to connect the heavily doped Si substrate. The top gate is made by using a liquid electrolyte in contact with the top gate electrode. Since the liquid electrolyte is close to graphene in structure, the side electrode is effectively acting like a top gate. A 1 nm thick double layer capacitor is formed between the graphene layer and the liquid electrolyte, introducing a large capacitance (capacitance per unit area $C=k\varepsilon_0/d$ where k is the dielectric constant and d is the thickness between the graphene layer and the liquid electrolyte). The liquid electrolyte is efficient in inducing a large carrier density in graphene due to the formation of the capacitor. The resistance shows a maximum at the CNP and it shows a sharp drop on either side of the CNP. The hysteresis of the resistivity is because that the charges trap at the interface between the graphene layer and the electrodes. It can be seen that the hysteresis here is severer than that in FIG. 3(c) indicating more charges are trapped here in the 10-layer CVD sample. The carrier density (n) increases linearly on both sides of the CNP.

Referring to FIG. 6(b), graphs 640 of magnetoresistance are depicted as a function of the external magnetic field at top gate voltages from −1.6 V to 2.0 V at a temperature of 140 K. It is clear that magnetoresistance is largest near the CNP. The magnetoresistance at 300 K (not shown) at various top gate voltages is very similar with that at 140 K, but has a slight increase in the magnitude of magnetoresistance. FIG. 6(c) depicts graphs 660 of magnetoresistance as a function of the external magnetic field at back gate voltages from −60 V to 100 V at a temperature of 300 K. A similar trend is seen as that of top gated configuration; however, the magnitude of the magnetoresistance is slightly higher, which could be a result of the difference in mobility due to environmental effects as the top surface is much more sensitive than the bottom. It is to note that the magnetoresistance value of close to 100% in the top gated CVD graphene sample and of 200% in the back gated CVD graphene sample are much lower than that of the scotch tape sample as shown in FIG. 5. This is due to the poor mobility of CVD graphene as compared to exfoliated (scotch tape) graphene sample where the mobility is much higher.

Figure 7:
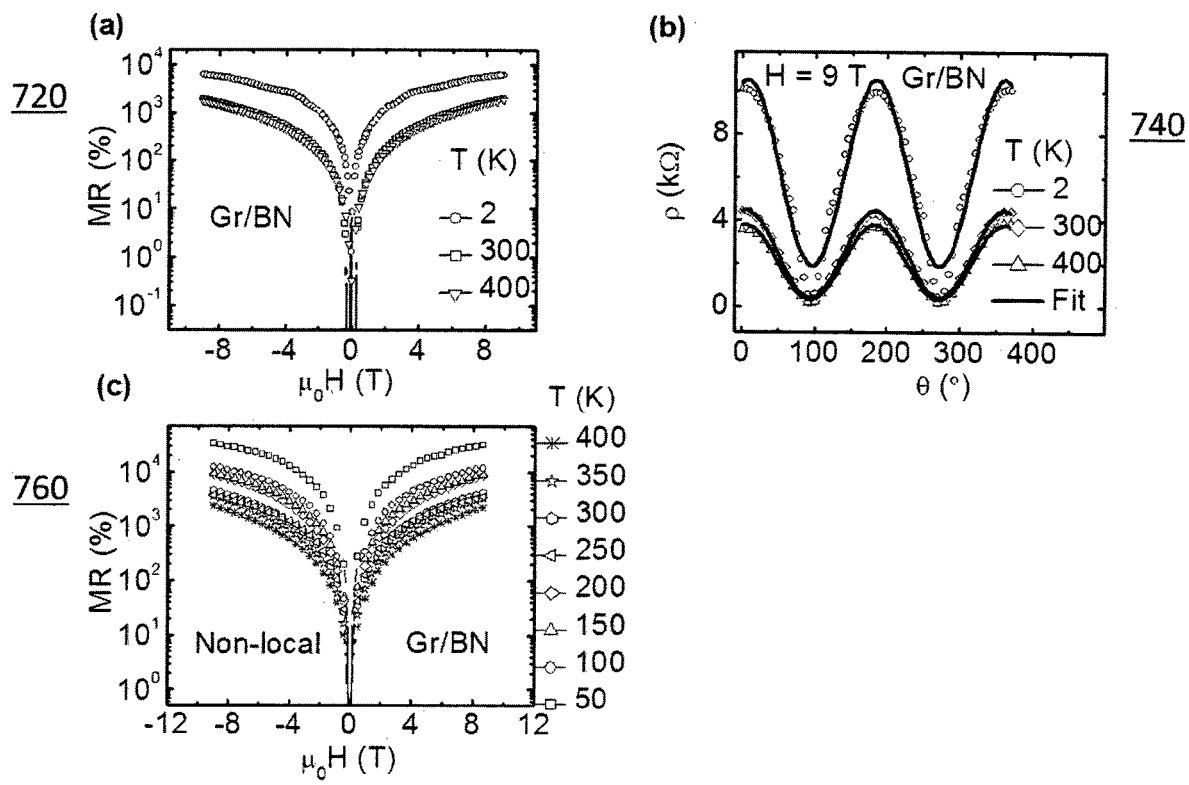
FIG. 7(a) depicts magnetoresistance graphs of a 5-6 layer graphene sample on a Boron nitride substrate as a function of the external magnetic field at temperatures of 2 K, 300 K and 400 K.
FIG. 7(b) depicts a resistivity graph as a function of the angle of the external magnetic field from out-of-plane (θ=0°) to in-plane (θ=90°) through 360° at temperatures of 2 K, 300 K and 400 K.
FIG. 7(c) depicts magnetoresistance graphs as a function of the external magnetic field at temperatures of from 50 K to 400 K obtained by a non-local measurement.

Referring to FIG. 7(a), magnetoresistance graphs 720 of a 5-6 layer graphene structure sample on a Boron nitride substrate is depicted as a function of the external magnetic field at temperatures of 2 K, 300 K and 400 K. No gate voltage is applied here. A maximum magnetoresistance of ~2000% at 400 K is obtained at a magnetic field of 9 T. The magnetoresistance almost remains unchanged as a function of the magnetic field as the sample is cooled to 300 K. This suggests the sample has a very small TCR during this temperature range. Surprisingly, when the sample is cooled to 2 K, the magnetoresistance increased to a very large value of ~6000% at a 9 T magnetic field. This large increase at low temperature may suggest the appearance of quantum effects.

Referring to FIG. 7(b), a resistivity graph 740 is depicted as a function of the orientation angle of the external magnetic field at temperatures of 2 K, 300 K and 400 K. The magnetoresistance is measured at different magnetic field orientations with respect to the sample plane. The magnetic field orientation has been changed from out-of-plane (θ=0°) to in-plane (θ=90°) in a complete cycle of 360° with a constant magnetic field of 9 T. The magnetoresistance is maximum when the magnetic field is normal to the sample plane (i.e. at θ=0°, 180° and 360°) due to the Lorentz force. The Lorentz force is defined as $\vec{F}=q(\vec{v}\times\vec{H})$, where q is the charge of the carriers, v is the in-plane velocity along the current direction and H is the strength of the magnetic field. The Lorentz force is at its maximum while the magnetic field is normal to the sample plane which causes deflection of the charged particles in the graphene plane and results in the maximum magnetoresistance. At 400 K and 300 K, the magnetoresistance follows a cosine relationship with angle confirming the role of Lorentz force, the magnetoresistance here referred as a classical magnetoresistance. However, at a temperature of 2 K, the magnetoresistance deviates from simple cosine behaviour and in particular, increases when the magnetic field is at around θ=90° and 180°. This deviation strongly points to the presence of an additional contribution to the magnetoresistance, most probably, a quantum origin to the magnetoresistance. Accordingly, the magnetoresistance related to the quantum origin is referred as quantum magnetoresistance. At 400 K only the classical magnetoresistance exists in the graphene structure and at 2 K the classical magnetoresistance dominates as the deviation is minimal. From the cosine fit, it is calculated that the quantum related magnetoresistance at 2 K is only ~700% as compared to a classical magnetoresistance of ~5300% at 300 K and 400 K. This thus unambiguously separates the classical and quantum magnetoresistance contributions due to the quantity of the magnetoresistance. In addition, the magnetoresistance measurements as a function of the orientation of the magnetic field within the graphene plane show negligible magnetoresistance in the whole range of magnetic field orientation within the graphene plane as the thickness of the graphene layers are very thin to have any effect on the resistance due to Lorentz force. This further confirms a classical Lorentz force induced magnetoresistance arising from the interaction of charged particles with the lattice planes.

Referring to FIG. 7(c), magnetoresistance graphs is depicted as a function of the external magnetic field at temperatures of from 50 K to 400 K obtained by a non-local measurement. To improve the low magnetic field sensitivity of the graphene sensor, non-local measurement of the resistance has been carried out. Surprisingly, the non-local magnetoresistance is very large reaching ~35000% at 50 K. The non-local magnetoresistance is still quite large at 400 K for practical applications which is ~2500% at a 8 T magnetic field. The magnetic field sensitivity at low fields is 0.05 mV/mT in a field range of 20 mT, which is quite comparable with the existing devices, however graphene can offer cost effective devices as the material thickness is only a few nanometers in comparison to microns in InSb based devices. With the advantage of large area chemical vapor deposition technique (CVD), the sensor can be easily scalable to meet the market demands.

Thus, in accordance with the present embodiment, an advantageous graphene structure and a magnetoresistance sensor including the graphene structure are provided. A giant magnetoresistance of ~2000% is observed at 400 K from a multilayer graphene structure on a Boron nitride substrate. The magnetoresistance is gate voltage tunable. This provides additional capabilities for the sensor. The graphene structure is weakly temperature dependent in the temperature range of 300 to 400 K. This solves the temperature drift problem in the existing magnetic sensors. Classical magnetoresistance dominates in the temperature range of 2 to 400 K with a very small contribution from quantum effects. The graphene structure on a Boron nitride substrate significantly enhances the magnetoresistance due to improved mobility in comparison to $SiO_2$ substrate. This provides a high sensitivity sensor in both low magnetic fields and high magnetic fields. Non-local way of resistance measurement significantly improves the overall sensitivity to low magnetic fields making layered materials very promising for the next generation sensing devices. Additionally, graphene based magnetoresistance sensors detect magnetic fields normal to the sample plane and the sensitivity is weak for in-plane magnetic fields, thus eliminating the possibility of cross field error. The magnetoresistance sensor has potential applications in perpendicular magnetic recording and magnetic field sensing (position sensors, speed sensors, etc). Furthermore, graphene based magnetoresistance sensors are cost effective as graphene is available from different sources, such as food, insect and waste. Also, 1 nm of multilayer graphene is much cheaper than micro thick InSb. Lastly, graphene is easily transferred to any substrate including plastic whereas InSb requires epitaxial growth on GaAs substrates. While exemplary embodiments have been presented in the foregoing detailed description of the invention, it should be appreciated that a vast number of variations exist. For example, those skilled in the art will realize from the teachings herein that the present technology may also be applied to angle sensing, position sensing, optical pumping, nuclear precession or superconducting quantum interference device (SQUID).

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A graphene structure comprising:
   a substrate layer; and
   at least two graphene layers disposed on the substrate layer, wherein each graphene layer consists of a single layer of carbon atoms arranged in a honey-comb fashion, the at least two graphene layers having gate electrodes fabricated thereon and comprising a gate voltage tuned graphene layer and an effective graphene layer, the effective graphene layer comprising one or more graphene layers,
   wherein each layer of the graphene structure has a three dimensional (3D) carrier density and a charge mobility;
   wherein the charge mobility of the gate voltage tuned graphene layer is higher than the charge mobility of the effective graphene layer;
   wherein a magnetoresistance ratio of the graphene structure is determined by a difference in the charge mobility or the carrier density between the gate voltage tuned graphene layer and the effective graphene layer, and wherein the charge mobility or the carrier density of the gate voltage tuned graphene layer is tunable by a gate voltage applied to the graphene structure through the gate electrodes, and wherein the gate electrodes are in contact with the gate voltage tuned graphene layer; and
   wherein a largest magnetoresistance ratio is obtained when the gate voltage of the graphene structure is at a charge neutrality point (CNP), and wherein equal number of electrons and holes exist at the charge neutrality point.

2. The graphene structure of claim 1, wherein the number of the graphene layers is 2 to 6.

3. The graphene structure of claim 1, wherein the graphene structure is arranged such that a magnetic field is applied perpendicular to a plane of the graphene layers in use.

4. The graphene structure of claim 1, wherein the gate voltage tuned graphene layer is below the effective graphene layer.

5. The graphene structure of claim 1, wherein the gate voltage tuned graphene layer is on top of the effective graphene layer.

6. The graphene structure of claim 1, wherein the magnetoresistance ratio is temperature independent.

7. A magnetic field sensor comprising:
a graphene structure on a base layer;
a substrate layer; and
a plurality of electrodes positioned in parallel on top of the graphene structure and in contact with a top layer of the graphene, wherein the graphene structure lies between the electrodes and a base layer; wherein the graphene structure comprises:
at least two graphene layers disposed on the substrate layer, wherein each graphene layer consists of a single layer of carbon atoms arranged in a honey-comb fashion, the at least two graphene layers having gate electrodes fabricated thereon and comprising a gate voltage tuned graphene layer and an effective graphene layer, the effective graphene layer comprising one or more graphene layers,
wherein each layer of the graphene structure has a three dimensional (3D) carrier density and a charge mobility;
wherein the charge mobility of the gate voltage tuned graphene layer is higher than the charge mobility of the effective graphene layer;
wherein a magnetoresistance ratio of the graphene structure is determined by a difference in the charge mobility or the carrier density between the gate voltage tuned graphene layer and the effective graphene layer, and wherein the charge mobility or the carrier density of the gate voltage tuned graphene layer is tunable by a gate voltage applied to the graphene structure through the gate electrodes, and wherein the gate electrodes are in contact with the gate voltage tuned graphene layer; and
wherein a largest magnetoresistance ratio is obtained when the gate voltage of the graphene structure is at a charge neutrality point (CNP), and wherein equal number of electrons and holes exist at the charge neutrality point.

8. The magnetic field sensor of claim 7, wherein the number of the graphene layers is 2 to 6.

9. The magnetic field sensor of claim 7, wherein the magnetic field sensor is arranged such that a magnetic field is applied perpendicular to a plane of the graphene layers in use.

10. The magnetic field sensor of claim 7, wherein the gate voltage tuned graphene layer is below the effective graphene layer.

11. The magnetic field sensor of claim 7, wherein the gate voltage tuned graphene layer is on top of the effective graphene layer.

12. The magnetic field sensor of claim 7, wherein the magnetoresistance ratio is temperature independent.

13. The magnetic field sensor of claim 7, wherein the substrate layer is Boron nitride.

14. The magnetic field sensor of claim 7, wherein the at least two graphene layers and the substrate layer constitutes a thin film, the thin film further comprising: the base layer below the substrate layer.

15. The magnetic field sensor of claim 14, wherein the base layer is flexible.

16. The magnetic field sensor of claim 7, wherein the at least two graphene layers lie between the electrodes and the substrate layer.

* * * * *